United States Patent [19]

Nagakubo

[11] Patent Number: 4,523,369

[45] Date of Patent: Jun. 18, 1985

[54] METHOD FOR MANUFACTURING A SEMICONDUCTOR DEVICE

[75] Inventor: Yoshihide Nagakubo, Kawasaki, Japan

[73] Assignee: Tokyo Shibaura Denki Kabushiki Kaisha, Kawasaki, Japan

[21] Appl. No.: 423,107

[22] Filed: Sep. 24, 1982

[30] Foreign Application Priority Data

Mar. 31, 1982 [JP] Japan ................... 57-53530

[51] Int. Cl.³ .................. H01L 21/76; H01L 21/265
[52] U.S. Cl. .................. 29/576 W; 29/578; 29/580; 148/1.5; 148/DIG. 85
[58] Field of Search .............. 29/576 W, 578, 580; 357/49, 50; 148/1.5, DIG. 85; 156/643

[56] References Cited

U.S. PATENT DOCUMENTS

4,140,558  2/1979  Murphy et al. ............. 148/175
4,394,196  7/1983  Iwai ...................... 29/571

Primary Examiner—Melvyn J. Andrews
Attorney, Agent, or Firm—Finnegan, Henderson, Farabow, Garrett & Dunner

[57] ABSTRACT

The invention provides a method for manufacturing a semiconductor device, having the steps of: forming a first mask member which has an opening to expose a desired portion of one major surface of a semiconductor substrate; doping an impurity which has the same conductivity type as that of the semiconductor substrate through the opening of the first mask member to form an impurity region of a high concentration in the surface layer of the semiconductor substrate; forming a second mask member on the side surface of the opening of the first mask member while the first mask member is left as it is; forming a groove by selectively etching the semiconductor substrate using the first and second mask members, and at the same time leaving an impurity region of the high concentration at least on the side surface of the groove; and burying an insulating isolation material in the groove.

7 Claims, 21 Drawing Figures

METHOD FOR MANUFACTURING A SEMICONDUCTOR DEVICE

BACKGROUND OF THE INVENTION

The present invention relates to a method for manufacturing a semiconductor device and, more particularly, to an improvement in an element isolation technique in the manufacture of integrated circuits (ICs).

In the field of integrated circuits, semiconductor elements are more micronized recently. Along with this tendency, various element isolation techniques have been developed. A method is known which forms an insulating material on the selectively etched portion of the semiconductor substrate to isolate elements. However, the above method has the following drawbacks.

Figure 1:
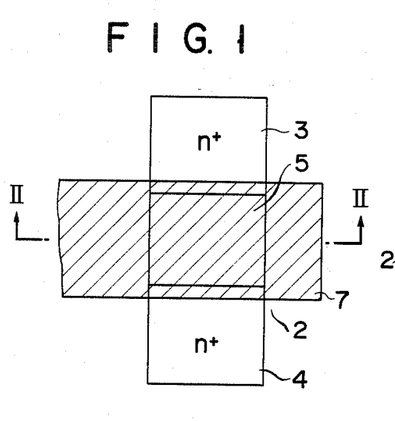
FIG. 1 is a plan view of a conventional MOSFET.
Figure 2:
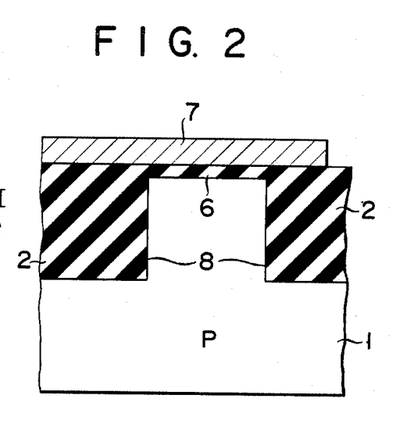
FIG. 2 is a sectional view of the MOSFET taken along the line II—II in FIG. 1.

Such drawbacks will be described in detail with reference to FIGS. 1 and 2. FIG. 1 is a plan view of a MOSFET, and FIG. 2 is a sectional view thereof taken along the line II—II of FIG. 1. A semiconductor substrate 1 comprises p-type silicon. An island element region which is isolated by a thick silicon oxide layer 2 is formed on the p-type semiconductor substrate 1. N-type source and drain regions 3 and 4 which are electrically insulated from each other are formed in the element region. A p-type channel region 5 is formed between the n-type source and drain regions 3 and 4. A gate electrode 7 of polycrystalline silicon is deposited on the channel region 5 through a gate oxide layer 6. It is noted that the element region of the p-type semiconductor substrate 1 formed by etching to extend above the level of the other surface portions, and the silicon oxide layer 2 is formed to surround the element region.

Figure 3:
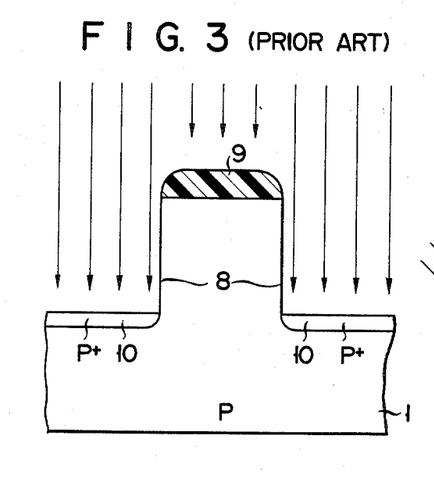
FIG. 3 is a sectional view showing a channel-cut region in a conventional method in which ion-implantation is performed perpendicularly to one major surface of a semiconductor substrate.
Figure 4:
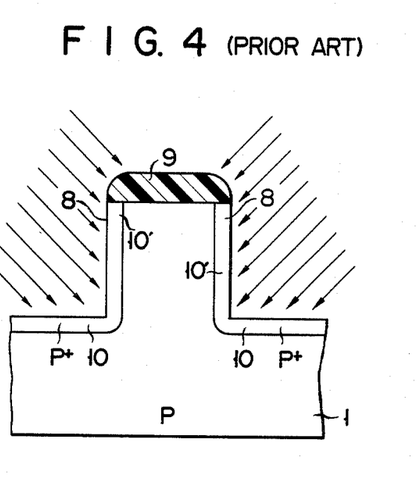
FIG. 4 is a sectional view showing a channel-cut region in a conventional method in which ion-implantation is performed obliquely with respect to one major surface of the semiconductor substrate.

In the operation of the MOSFET with the above arrangement, when an input voltage is applied across the gate electrode 7 to generate an electric field, a channel is formed on the surface of the channel region 5 of the p-type semiconductor substrate 1 beneath the gate oxide layer 6 so as to transmit the signal. However, since the element region extends above the surface of the p-type semiconductor substrate 1, a parasitic channel is formed due to various causes on side surfaces which connect the n-type source and drain regions 3 and 4. Generally, in order to prevent a parasitic channel, a highly concentrated impurity is doped therein. For this purpose, various methods such as gas-phase or solid-phase diffusion method may be adopted to increase the concentration of the impurity in side surfaces 8. However, in a channel-cut region which functions as the channel stopper of a MOSFET, the amount of the impurity must be precisely controlled. In this sense, ion-implantation is the best method to increase the concentration of the impurity. However, ion-implantation has directivity. As shown in FIG. 3, the p-type semiconductor substrate 1 is selectively etched to expose a portion thereof, using a mask member 9 which comprises a resist material and which has a predetermined shape. Thereafter, a p-type impurity such as boron is ion-implanted perpendicularly to one major surface of the p-type semiconductor substrate 1 to form $p^+$-type channel-cut regions 10 in the etched bottom portions. However, channel-cut regions are not formed on the side surfaces 8 of the element region. In order to form $p^{30}$-type channel-cut regions on the side surfaces 8 of the element region, as shown in FIG. 4, the impurity must be ion-implanted obliquely with respect to one major surface of the semiconductor substrate 1. Thus, channel-cut regions 10' are formed respectively on the side surfaces 8 of the element region. However, the side surfaces of the element region which extend above other surface portions of the semiconductor substrate are oriented in various directions in an integrated circuit. Therefore, it is not desirable to ion implant the impurity obliquely in mass production.

SUMMARY OF THE INVENTION

It is an object of the present invention to provide a method for manufacturing a semiconductor device, wherein channel-cut regions are readily and uniformly formed respectively on the side surfaces of an element region extending above any other surface portions of a semiconductor substrate.

According to an embodiment of the present invention, there is provided a method for manufacturing a semiconductor device, comprising the steps of: forming a first mask member which has an opening to expose a desired portion of one major surface of a semiconductor substrate; doping an impurity which has the same conductivity type as a conductivity type of said semiconductor substrate through said opening of said first mask member to form an impurity region of a high concentration in a surface layer of said semiconductor substrate; forming a second mask member on a side surface of said opening of said first mask member while said first mask member is left as it is; forming a groove by selectively etching said semiconductor substrate using said first and second mask members, and at the same time leaving an impurity region of the high concentration at least on a side surface of said groove; and burying an insulating isolation material in said groove.

According to another embodiment of the present invention, there is also provided a method for manufacturing a semiconductor device, comprising the steps of: forming a first mask member which has an opening to expose a desired portion of one major surface of a semiconductor substrate; forming a second mask member on a side surface of said opening; forming a groove by selectively etching said semiconductor substrate using said first and second mask members; removing said second mask member; doping an impurity which has the same conductivity type as a conductivity type of said semiconductor substrate through said opening of said first mask member to form an impurity region of a high concentration at least on a side surface of said groove; and burying an insulating isolation material in said groove.

DETAILED DESCRIPTION OF THE PREFERRED EMBODIMENTS

An embodiment of the present invention will be described with reference to the manufacturing steps. A first mask member which has an opening of a desired shape is formed on a semiconductor substrate. The first mask member may comprise a metal pattern such as an aluminum pattern, or a pattern such as a silicon oxide pattern or a silicon nitride pattern. Alternatively, a thin silicon oxide film may be interposed between the first mask member and the semiconductor substrate. With such an arrangement, the surface of the semiconductor substrate may not be damaged and contaminated when reactive ion etching is performed using the first mask member to form a second mask member.

An impurity which has the same conductivity type as that of the semiconductor substrate is ion-implanted or thermally diffused in the semiconductor substrate through the opening of the first mask member to form an impurity region of a high concentration.

A thin film as a second prospective mask member is deposited on the first mask member to cover the entire surface to a thickness greater than half of the width of the opening of the first mask member. The thin film must be made of a material which is etched using the first mask member as a mask. For example, if the first mask member comprises aluminum, the thin film may comprise a silicon oxide or silicon nitride film. If the first mask comprises silicon nitride, the thin film may comprise an aluminum or silicon oxide film. Subsequently, anisotropic etching such as reactive ion etching (RIE) is performed to etch the thin film perpendicularly to one major surface of the semiconductor substrate along the entire thickness of the thin film. Thus, the second mask member is left on the side surface of the opening of the first mask member.

The impurity region under the semiconductor substrate, or the impurity region and the portion of the semiconductor substrate thereunder are selectively etched by anisotropic etching such as the RIE method to form a groove and to leave the impurity portion on the side surface of the groove. The side surface of the groove becomes vertical or substantially vertical. Thereafter, an impurity which has the same conductivity type as that of the semiconductor substrate is ion-implanted in the bottom of the groove using the first and second mask members and is doped to form an impurity region of a high concentration. Channel-cut regions are formed on the side surface of the convex-shaped element region and the etched surface (bottom surface of the groove), in the same structure described with reference to FIG. 4.

Thereafter, an isolating material is filled in the groove in which the channel-cut regions are formed on the side surface and the bottom surface. Thus, the element isolation region is formed to electrically isolate the island semiconductor region (element formation region) surrounded by the groove. The groove may be formed by the following methods:

(1) A silicon nitride film which is an antioxidant film is used as the first mask member. After the second mask member is removed, the inner surface of the groove formed in the substrate is directly oxidized. Thus, the isolation member comprising the oxide film is formed in the groove.

(2) If the width of the groove is small, an insulating film is deposited by the PVD or CVD method to sufficiently fill the groove. Thereafter, the insulating film is etched back to leave the insulating film in the groove. Thus, the isolation member is formed. The insulating material may comprise $SiO_2$, $Si_3N_4$ or $Al_2O_3$. A low fusible insulating material such as phospho-silicate glass or boro-silicate glass may also be used in place of the above insulating material.

(3) If the width of the groove is small, a material to be oxidized such as polycrystalline silicon or amorphous silicon is deposited by the PVD or CVD method to sufficiently fill the groove. Thereafter, the material is etched to the extent that it is left in the groove. Thermal oxidation is then performed to convert the material to an oxide. Thus, the isolating material is formed.

In methods (2) and (3), after the first and second mask members are completely removed, an insulating film or a film which comprises a material to be oxidized may be deposited. Alternatively, in the condition that the second mask member is removed and the first mask member remains, the insulating film or a film which comprises a material to be oxidized may be deposited. Especially, in the latter process, after the insulating film, or a film which comprises a material to be oxidized, is deposited, the film is etched to expose the first mask member. The isolating material which extends above the surface of the semiconductor substrate is formed to cover the side surface of the groove and the side surface of the residual impurity portion. When the isolating member extending above the surface of the semiconductor substrate is formed, the junctions between the source region and the semiconductor substrate and between the drain region and the semiconductor substrate may not be exposed through the surface of the semiconductor substrate. Especially, the junctions may not be short-circuited when source and drain electrodes are deposited.

As described above, the present invention provides a method for manufacturing a semiconductor device, wherein an impurity which has the same conductivity type as that of the semiconductor substrate is doped in the semiconductor substrate through the opening of the first mask member to form an impurity region of a high concentration, a second mask member is formed on the side surface of the opening of the first mask member, and a channel-cut region is easily formed with excellent controllability on the side surface of the element region extending above the surface of the semiconductor substrate by selectively etching the semiconductor substrate using the first and second mask members.

Another embodiment of the present invention will be described in detail hereinafter.

In the same manner as in the first embodiment, a first mask member which has an opening with a desired shape is formed on a semiconductor substrate. After a thin film as a prospective second mask member is deposited on the first mask member to cover the entire surface to a thickness less than the width of the opening, anisotropic etching such as the RIE method is performed to vertically etch the thin film with respect to the major surface of the semiconductor substrate along the entire thickness of the thin film. Thus, the thin film portion is left on the side surface of the opening of the first mask member. Thus, the second mask member is formed.

The semiconductor substrate is selectively etched to form a groove using the first and second mask members. After the second mask member is removed, an impurity which has the same conductivity type as that of the semiconductor substrate is ion-implanted and is diffused to form impurity regions of a high concentration on the side surface and the bottom of the groove. Thus, the same structure obtained with reference to FIG. 4 is obtained in which channel-cut regions are formed on the side surface of the convex-shaped element region 10 and the etched surface (bottom of the groove).

Thereafter, an isolation member is formed in the side surfaces and the bottom of the groove which has the channel-cut regions therein in accordance with one of methods (1) to (3) described above. Thus, the island semiconductor region surrounded by the groove is electrically isolated by the element isolation region.

The second embodiment is the same as the first embodiment except that the order of the step of forming the groove and the step of forming an impurity region of a high concentration on the side surface of the groove is reversed. In the same way as in the first embodiment, the second embodiment of the present invention provides a method for manufacturing a semiconductor device wherein a channel-cut region can be readily formed with excellent controllability on the side surface of the element region which extends above the surface of the semiconductor substrate.

An example will be described with reference to the accompanying drawings in which the present invention is applied to the manufacture of an n-channel MOSLSI.

EXAMPLE 1

Figure 5A:
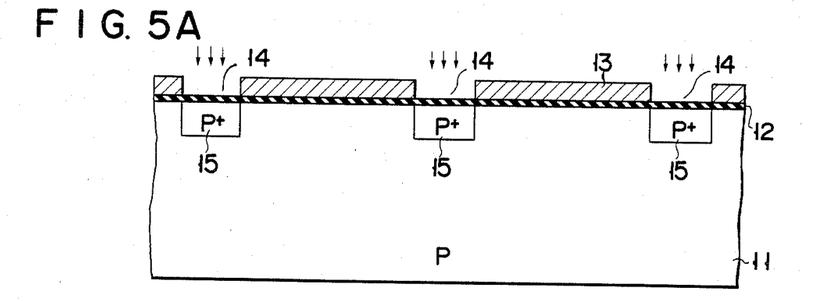
FIGS. 5A to 5H are sectional views for explaining the steps of manufacturing an n-channel MOSLSI according to a first embodiment of the present invention.

(i) As shown in FIG. 5A, a silicon oxide film 12 of about 1,000 Å thickness was grown by thermal oxidation on the major surface of a p-type silicon substrate 11 whose impurity concentration was $3 \times 10^{13}$ cm$^{-3}$. An aluminum film was then deposited by vacuum deposition to cover the entire surface to a thickness of about 5,000 Å. Lattice-shaped openings 14 were formed by patterning the aluminum film except for the portions of prospective element isolation regions. A p-type impurity (boron) was then ion-implanted at a dose of $1 \times 10^{13}$ cm$^{-2}$ and at an acceleration concentration of 200 KeV in the silicon substrate 11 through the silicon oxide film 12 using a first mask pattern 13 which comprised the aluminum. The impurity was activated to form p+-type impurity regions 15. In this case, the depth of each of the p+-type impurity regions 15 was 0.3 μm. Furthermore, the impurity was diffused in an atmosphere of N$_2$ gas for about 20 minutes and each of the p+-type impurity regions 15 had a final depth of 0.5 μm.

Figure 5B:
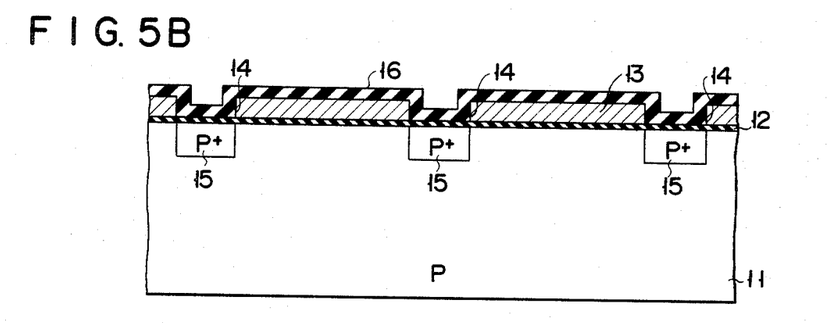
Figure 5C:
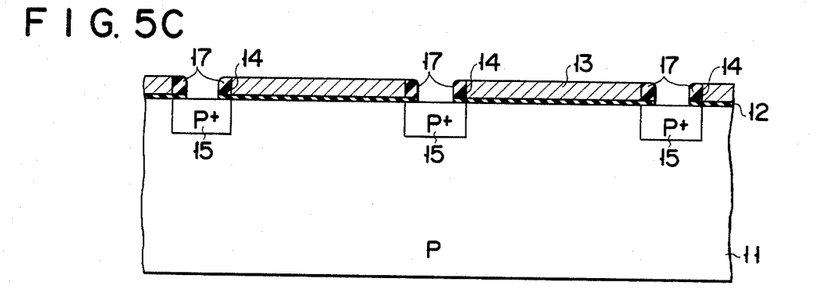

(ii) As shown in FIG. 5B, a thin CVD-SiO$_2$ film 16 was deposited to cover the entire surface to a thickness (e.g., 3 μm) less than half of the width of the opening 14. Subsequently, anisotropic etching such as RIE was performed to etch the CVD-SiO$_2$ film 16 vertically with respect to the major surface of the silicon substrate 11, as shown in FIG. 5C. The silicon oxide film 12 was subsequently etched by the RIE method. In this case, power for the RIE method was set to the general high frequency power, and CF$_4$ gas (Freon gas) was used as the etchant. As shown in FIG. 5C, second mask patterns 17 which comprised thin SiO$_2$ films were left on the side surfaces of the openings 14 of the first mask patterns 13.

Figure 5D:
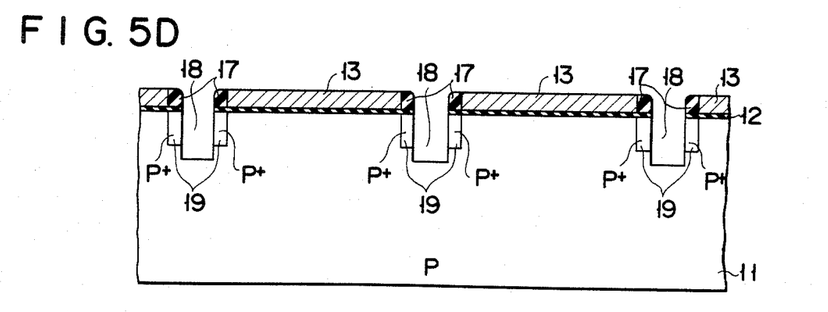
Figure 5E:
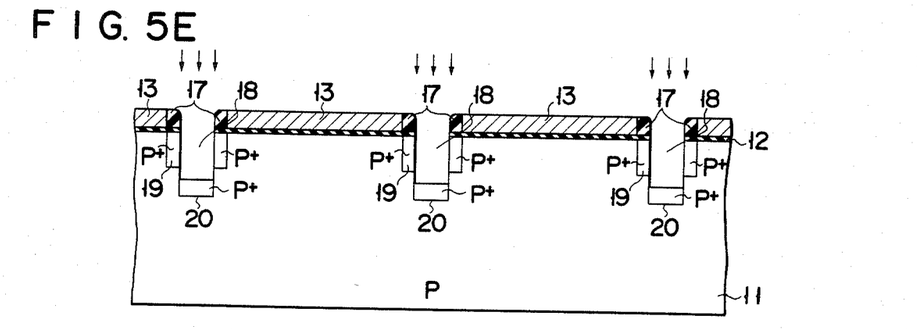

(iii) As shown in FIG. 5D, the exposed portions of the silicon substrate 11 were etched by the RIE method using the first and second mask patterns 13 and 17 to form grooves 18 each of which had vertical or substantially vertical side surfaces and had a depth of 0.6 μm. In this case, a gas mixture of Cl$_2$ gas and H$_2$ gas was used as an etchant. P+-type channel cut regions 19 were respectively left at the side surfaces of the groove 18. Since the depth of the groove 18 was 0.6 μm, the bottom thereof reached the silicon substrate 11 beyond the bottom of the p+-type channel-cut region 15. As shown in FIG. 5E, boron was ion-implanted in the silicon substrate 11 at a dose of about $1 \times 10^{13}$ cm$^{-2}$ and at an acceleration voltage of 40 KeV using the second mask patterns 17 and the first mask patterns 13. Boron was then diffused to form p+-type channel stoppers 20 in the bottoms of the grooves 18.

Figure 5F:
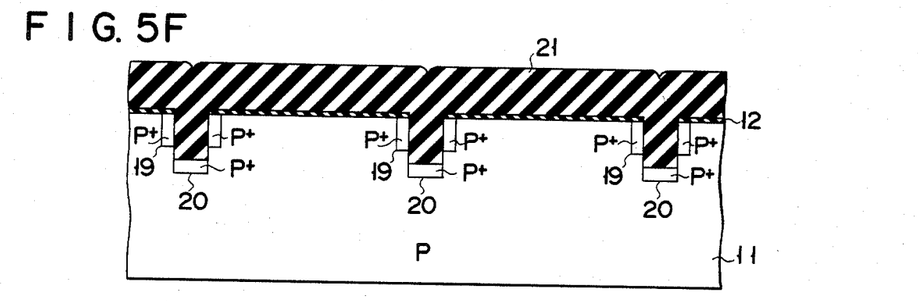
Figure 5G:
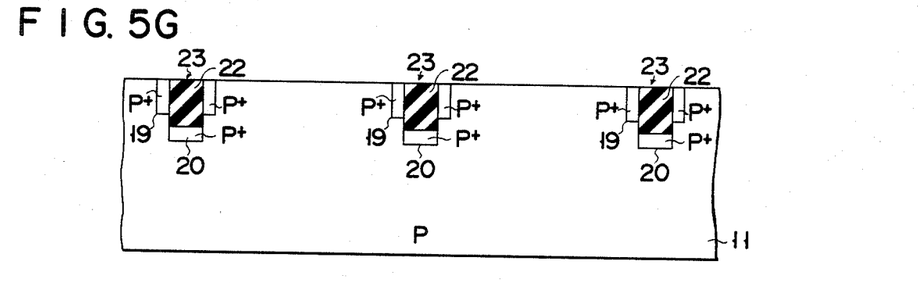

(iv) As shown in FIG. 5F, the first and second mask patterns 13 and 17 were removed completely, and a CVD-SiO$_2$ film 21 was deposited to cover the entire surface to a thickness greater than the width of the opening of the groove 18 (e.g. 2 μm). As shown in FIG. 5G, the CVD-SiO$_2$ film 21 and the silicon oxide film 12 thereunder were etched to expose the surface of the silicon substrate 11 and to leave the CVD-SiO$_2$ only in the grooves 18. Thus, lattice-shaped element isolation regions 23 of an insulating isolation material 22 were formed.

Figure 5H:
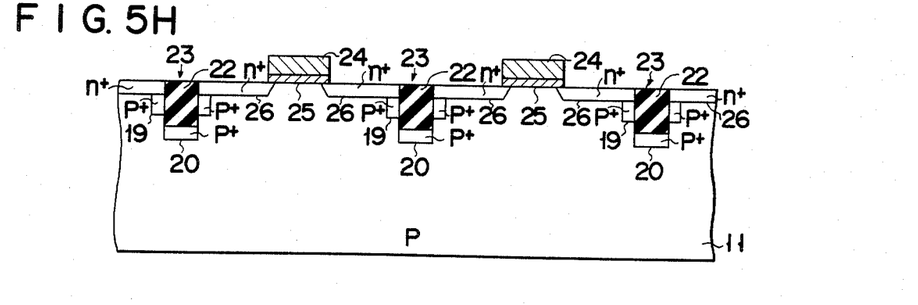

(v) As shown in FIG. 5H, an island region of the silicon substrate 11 which was isolated by the element isolation region 23 was thermally oxidized to grow an oxide film. Subsequently, an arsenic-doped polycrystalline silicon film was deposited on the oxide film. The arsenic-doped polycrystalline silicon film was then patterned to form a plurality of gate electrodes 24. The oxide film was then selectively etched using the gate electrodes 24 as masks, so that gate oxide films 25 were formed. An n-type impurity such as arsenic was ion-implanted in the silicon substrate using the gate electrodes 24 and the element isolation regions 23 as masks. Arsenic was then diffused to a depth of about 0.3 μm to form n+-type impurity regions 26 which functioned as the source and drain regions. Thus, an n-channel MOSFET which had a plurality of MOSLSIs was prepared.

According to Example 1, after the grooves 18 are formed which respectively constitute the element isolation regions 23 in the silicon substrate 11, the p+-type channel-cut regions 19 can be formed on the side surfaces of grooves 18 to have a thickness corresponding to the width of the second mask patterns 17. Therefore, unlike the conventional ion-implantation method, the impurity need not be obliquely doped. As a result, the channel-cut regions 19 are formed on the side surfaces of the grooves 18 which respectively constitute the element isolation regions. A parasitic channel which tends to be formed between the n+-type impurity regions 26 as the source and drain regions is prevented. Further, by arbitrarily changing the thickness of the residual CVD-SiO$_2$ patterns, a channel-cut region which has an arbitrary width can be formed on the side surface of the groove 18.

Furthermore, since the p+-type channel stoppers 20 are formed in the bottoms of the grooves 18, a channel may not be formed under the groove 18 in the silicon substrate 11.

Figure 6:
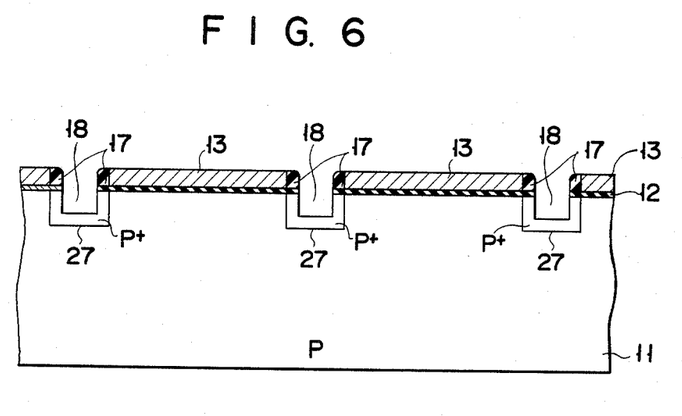
FIG. 6 is a sectional view for explaining the step of manufacturing an n-channel MOSLSI according to a modification of the first embodiment.

In the step described with reference to FIG. 5D, when the groove 18 is formed using the second mask patterns 17, its bottom reaches the silicon substrate 11 beyond the bottom of the p+-type region 15. However, as shown in FIG. 6, when the depth of the groove is set to be about 0.4 μm, which is one micron smaller than the depth (0.5 μm) of the p+-type region 15, a p+-type region 27 which functions both as the p+-type region (channel-cut region) 19 and the channel stopper 20 may be formed. In this case, the step of forming the channel stopper 20 can be omitted.

EXAMPLE 2

Figure 7A:
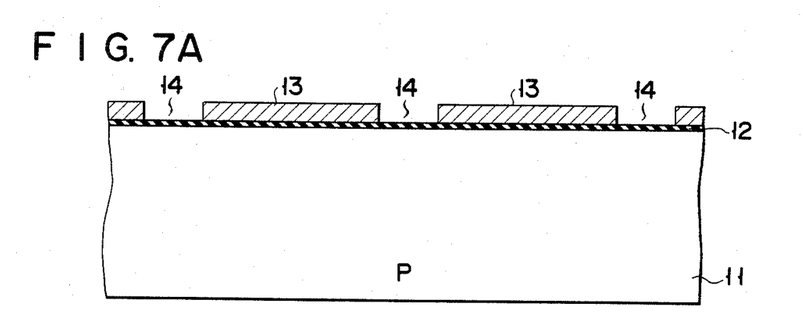
FIGS. 7A to 7H are sectional views for explaining the steps of manufacturing an n-channel MOSLSI according to a second embodiment of the present invention.
Figure 7B:
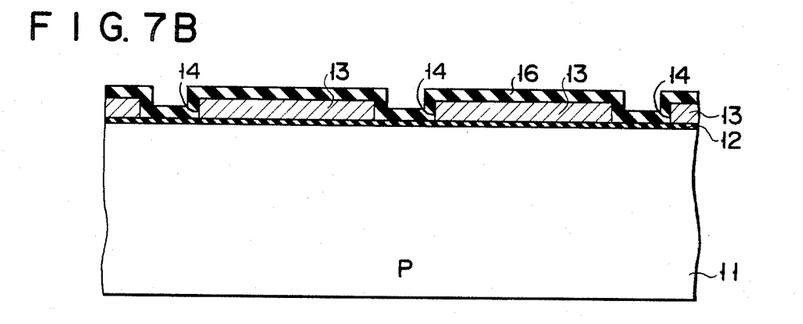
Figure 7C:
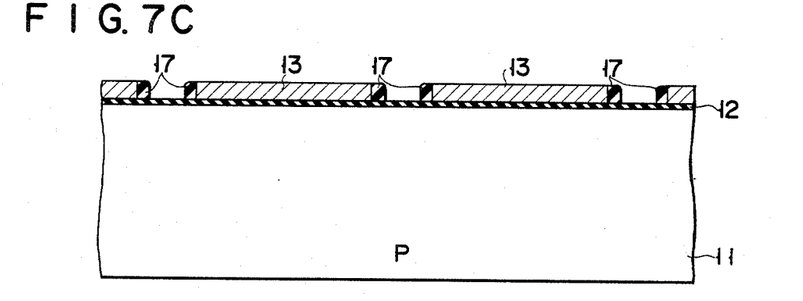
Figure 7D:
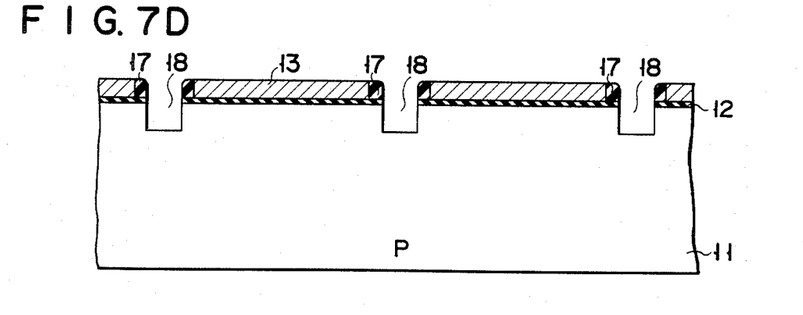

(i) In the same manner as in Example 1, as shown in FIG. 7A, first mask patterns 13 which respectively comprised aluminum films which had lattice-shaped openings 14 were formed on a p-type silicon substrate 11 through an oxide film 12. As shown in FIG. 7B, a thin CVD-SiO$_2$ film 16 was deposited to cover the entire surface including the area of the openings 14. As shown in FIG. 7C, the thin CVD-SiO$_2$ film 16 was etched by the RIE method along its entire thickness. In this case, second mask patterns 17 which respectively comprised thin CVD-SiO$_2$ films were formed on the side surfaces of the openings 14 of the first mask patterns 13.

Figure 7E:
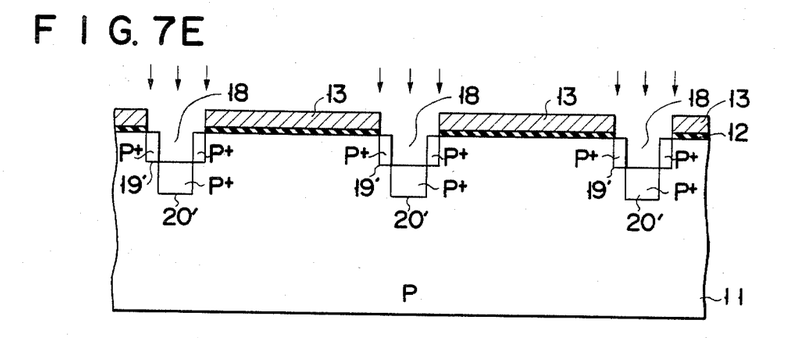

(ii) Using the first and second mask patterns 13 and 17, the exposed portions of the oxide film 12 and the portions of the silicon substrate 11 were etched by the RIE method to form grooves 18 which had vertical or substantially vertical side walls. The depth (0.6 μm) of the groove 18 was the same as that of Example 1. As shown in FIG. 7E, after the second mask patterns 17 and the portions of the oxide film 12 thereunder were etched by an etchant of ammonium fluoride, a p-type impurity (boron) was ion-implanted in the silicon substrate 11 using the first mask patterns 13 and was diffused to form p+-type channel-cut regions 19' on the side surfaces of the grooves 18. At the same time, p+-type channel stoppers 20' were formed in the bottoms of the grooves 18.

Figure 7F:
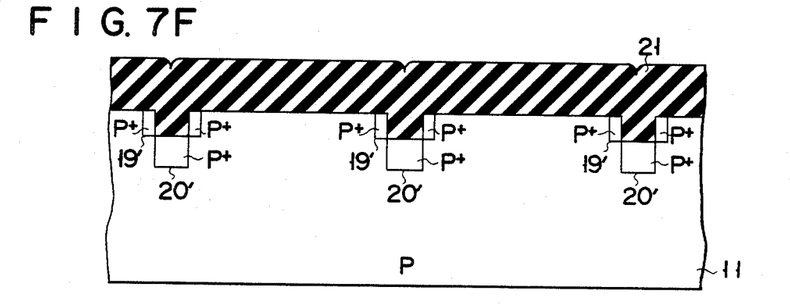
Figure 7G:
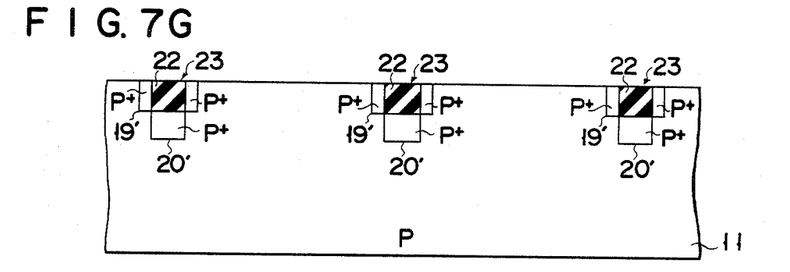

(iii) After the first mask patterns 13 were removed, as shown in FIG. 7F, an SiO$_2$ film 21 was deposited to cover the entire surface to a thickness greater than the width of the opening of the groove 18. As shown in FIG. 7G, the SiO$_2$ film 21 and the portions of the oxide film 12 thereunder were etched back to expose the major surface of the silicon substrate 11, so that SiO$_2$ was left in the grooves 18. Thus, lattice-shaped element isolation regions 23 of an insulating isolation material 22 (SiO$_2$) were formed.

Figure 7H:
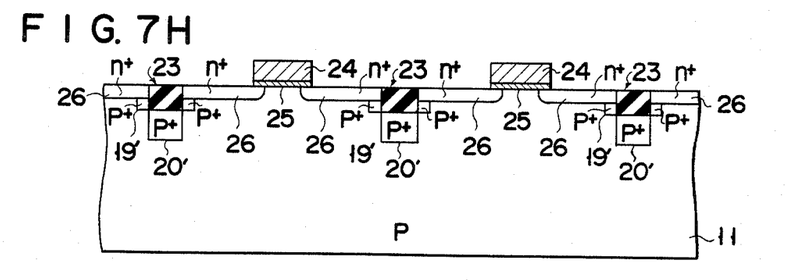

(iv) As shown in FIG. 7H, in the same manner as step (v) of Example 1, gate electrodes 24 were respectively formed in the element isolation regions 23 which were isolated from each other in the silicon substrate 11 through gate oxide films 25. Furthermore, n+-type regions 26 as the source and drain regions were formed to prepare a MOSLSI which had a plurality of n-channel MOSFETs.

According to Example 2, in the same manner as Example 1 but unlike the conventional method, oblique doping need not be performed to readily form the channel-cut regions 19' on the side surfaces of the deep grooves 18 of the element isolation regions 23.

The method of the present invention is not limited to the manufacture of the n-channel MOSLSI described above. The method may also be applied to the manufacture of a p-channel MOSLSI or a CMOSLSI.

Especially, when the method of the present invention is applied to the manufacture of the CMOSLSI, carrier-killer regions are formed by doping carbon, oxygen or a metal in the silicon substrate 11 using the first and second mask patterns 13 and 17, instead of forming the p+-type channel stoppers 20 by doping boron in the silicon substrate 11. A parasitic npn transistor between the elements due to latch-up phenomenon can be eliminated which presents a serious problem in the case of a CMOSLSI.

What is claimed is:

1. A method for manufacturing a semiconductor device comprising the steps of (a) forming a first mask member which has an opening to expose a desired portion of a major surface of a semiconductor substrate; (b) ion-implanting an impurity of the same conductivity type as that of said semiconductor substrate through said opening of said first mask member to form an impurity region of a high concentration in a surface layer of said semiconductor substrate; (c) substantially forming a second mask member only on a side surface of said opening of said first mask member while said first mask member is left as it is; (d) forming a groove by selectively etching said semiconductor substrate by using said first and second mask members, while at the same time leaving the impurity region of the high concentration at least on a side surface of said groove; and (e) burying an insulating isolation member in said groove.

2. The method according to claim 1, in which said step (d) comprises forming said groove such that a bottom thereof reaches the semiconductor substrate through said impurity region of the high concentration.

3. The method according to claim 2, in which said step (d) comprises, after forming said groove, ion-implanting an impurity of the same conductivity type as that of said semiconductor substrate by using said first and second mask members to form an impurity region of a high concentration on that bottom of said groove which is the surface layer of said semiconductor substrate.

4. The method according to claim 1, in which said step (d) comprises forming a groove such that a bottom thereof does not reach the semiconductor substrate with said region of the high concentration left.

5. The method according to claim 1, in which said step (b) comprises forming an impurity region of a high concentration in a surface layer of said semiconductor substrate by an ion-implantation method using an impurity dose of $1 \times 10^{13}$ cm$^{-2}$ when the impurity concentration of said semiconductor substrate is $3 \times 10^{13}$ cm$^{-3}$.

6. A method according to claim 1, wherein said first mask member comprises a material selected from the group consisting of silicon dioxide, silicon nitride and aluminum.

7. A method according to claim 1, wherein said second mask member can be etched using said first mask member as a mask.

* * * * *